United States Patent
Hasegawa et al.

(10) Patent No.: US 7,352,186 B2
(45) Date of Patent: Apr. 1, 2008

(54) NUCLEAR MAGNETIC RESONANCE PROBE COIL

(75) Inventors: Haruhiro Hasegawa, Kokubunji (JP); Hiroyuki Yamamoto, Kokubunji (JP); Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/798,016

(22) Filed: May 9, 2007

(65) Prior Publication Data

US 2007/0273379 A1 Nov. 29, 2007

(30) Foreign Application Priority Data

May 25, 2006 (JP) ............................ 2006-145006

(51) Int. Cl.
*G01V 3/00* (2006.01)
(52) U.S. Cl. ...................................... 324/322; 324/318
(58) Field of Classification Search ........ 324/300–322; 600/407–455; 526/60, 59; 432/37
See application file for complete search history.

(56) References Cited

U.S. PATENT DOCUMENTS

| | | | |
|---|---|---|---|
| 5,939,883 A * | 8/1999 | Green et al. ................. | 324/322 |
| 6,556,013 B2 | 4/2003 | Withers | |
| 6,842,004 B2 * | 1/2005 | Withers et al. ............. | 324/318 |
| 6,967,482 B2 * | 11/2005 | Morita et al. ................ | 324/322 |
| 7,084,635 B2 * | 8/2006 | Morita et al. ................ | 324/322 |

(Continued)

FOREIGN PATENT DOCUMENTS

JP 2005-003435 6/2003

(Continued)

OTHER PUBLICATIONS

Odoj, F., et al.,, "A superconducting probehead applicable for nuclear magnetic resonance microscopy at 7 T", American Institute of Physics, Review of Scientific Instruments, vol. 69, No. 7, Jul. 1998, pp. 2708-2712.

(Continued)

*Primary Examiner*—Brij Shrivastav
(74) *Attorney, Agent, or Firm*—Reed Smith LLP; Stanley P. Fisher, Esq.; Juan Carlos A. Marquez, Esq.

(57) ABSTRACT

Provided is a nuclear magnetic resonance probe coil that is included in a nuclear magnetic resonance apparatus in which the direction of a static magnetic field is horizontal and that can highly sensitively measure multiple nuclear species. A nuclear magnetic resonance apparatus includes a unit that horizontally applies a static magnetic field, a unit that vertically moves a specimen to a predetermined position in the apparatus, and a probe including in the distal part thereof a probe coil that applies a radiofrequency signal to the specimen and that detects a signal produced by the specimen. The probe coil includes multiple pairs of superconducting thin-film rings formed on respective substrates that are disposed in parallel with the static magnetic field while being separated from each other by a predetermined distance, a detection loop that detects a signal received by the superconducting thin-film rings, and a transmission coil that applies the radiofrequency signal to the specimen and that has the normal thereto extended horizontally.

11 Claims, 7 Drawing Sheets

U.S. PATENT DOCUMENTS 7,164,269 B2 * 1/2007 Hasegawa et al. .......... 324/318
7,295,011 B2 * 11/2007 Morita et al. ............... 324/322
2006/0119360 A1 * 6/2006 Yamamoto et al. ......... 324/318

FOREIGN PATENT DOCUMENTS

JP    2006-053020    8/2004
JP    2006-162258    12/2004

OTHER PUBLICATIONS

Miller, J.R., "Superconducting Receiver Coils for Sodium Magnetic Resonance Imaging," IEEE Transactions on Biomedical Engineering, vol. 43, No. 12, Dec. 1996, pp. 1197-1199.

* cited by examiner

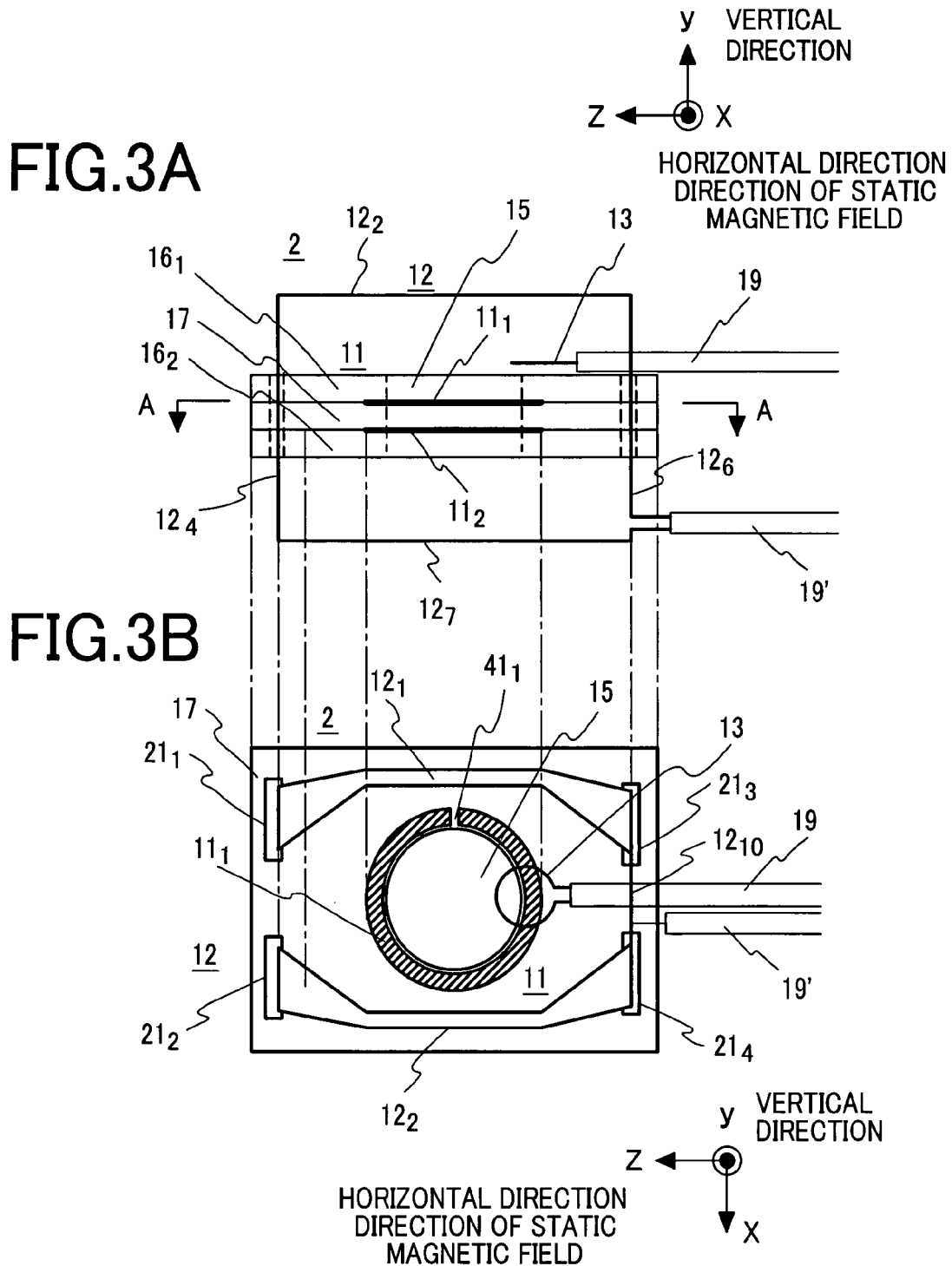

DIRECTION OF DETECTING MAGNETIC MOMENT (VERTICAL)

STATIC MAGNETIC FIELD (HORIZONTAL)

NUCLEAR MAGNETIC RESONANCE PROBE COIL

CLAIM OF PRIORITY

The present invention claims priority from Japanese application JP 2006-145006 filed on May 25, 2006, the content of which is hereby incorporated by reference on to this application.

BACKGROUND OF THE INVENTION (1) Field of the Invention

The present invention relates to the structure of a nuclear magnetic resonance probe that is included in a nuclear magnetic resonance (NMR) apparatus composed at least of a superconducting magnet which is a means for applying a static magnetic field to a specimen and a low-temperature probe having a probe coil formed in the distal part thereof, and that has the probe coil thereof realized with superconducting thin films formed on respective substrates.

(2) Description of the Related Art

The structure of a nuclear magnetic resonance probe coil realized with superconducting thin films has been discussed in, for example, "Review of Scientific Instruments" (Vol. 69, 1998, pp. 2708-2712) or the specification of U.S. Pat. No. 6,556,013. The documents describe the structure of a probe coil realized with superconducting thin films. The probe coil is realized by forming the superconducting thin films on respective substrates. For example, "IEEE Transactions on Biomedical Engineering" (Vol. 43, No. 12, 1996, pp. 1197-1199) has disclosed a superconducting thin-film ring formed on a substrate to include an interdigital capacitor.

The application of a large homogeneous static magnetic field to a specimen or the employment of a high-sensitivity probe coil is effective in realizing a high-resolution high-sensitivity nuclear magnetic resonance apparatus. For induction of a homogenous strong magnetic field, the diameter of a probe coil made of a wire material that generates a magnetic field should be decreased, and a space occupied by the probe coil should be limited. The probe coil forms a resonant circuit. For realization of a high-sensitivity probe coil, the quality (Q) factor of the probe coil should be improved. For a high Q factor, the resistance offered by the probe coil realizing the resonant circuit should be minimized.

Attempts to manufacture a probe coil using superconducting thin films have been discussed in the above documents. The DC resistivity of a superconductor is zero, and the resistance offered thereby at a radiofrequency is small. Therefore, the superconductor is useful as a component of the probe coil.

The adoption of a probe coil realized with superconducting thin films is helpful in attaining a high Q factor. However, a superconductor is perfectly diamagnetic by nature and has a large magnetic susceptibility of $-\frac{1}{4}\pi$. Therefore, the probe coil should be designed not to disorder a static magnetic field but to maintain the homogeneity of the static magnetic field.

"Review of Scientific Instruments" (Vol. 69, 1998, pp. 2708-2712) has introduced an example of a probe coil to which a static magnetic field is horizontally applied and which has superconducting thin-film rings formed on the face and back of a substrate. The normal to the surface of the substrate is extended vertically, and a specimen is put into the superconducting thin-film rings. Since the normal to the surface of the substrate and the direction of the static magnetic field are orthogonal to each other, a volume of the static magnetic field interacting with a superconductor is limited. Therefore, the disorder of the static magnetic field caused by the superconductor having a large magnetic susceptibility is limited. Since the specimen is put into the superconducting thin-film rings, a magnetic moment exhibited by the specimen can be highly efficiently measured. In other words, since a fill factor by which the specimen occupies the space where the probe coil can measure the magnetic moment is high, the foregoing structure is preferable for realizing a high-sensitivity probe coil. However, "Review of Scientific Instruments" (Vol. 69, 1998, pp. 2708-2712) is concerned with the probe coil including only one coil but has not taken account of a preferable structure including multiple coils needed to measure many nuclear species. Moreover, although the probe coil is magnetically coupled to a means for transmitting a signal, no consideration is taken into a method of strengthening the coupling and improving the signal intensity.

U.S. Pat. No. 6,556,013 describes an example of a probe coil to which a static magnetic field is applied horizontally and which has patterns or superconducting thin films formed on the surfaces of respective substrates. U.S. Pat. No. 6,556,013 discusses a structure designed to include multiple coils for the purpose of measuring many nuclear species. However, the direction of a static magnetic field is vertical. No consideration is taken into a structure including multiple coils and being adapted to a nuclear magnetic resonance apparatus in which the direction of a static magnetic field is horizontal.

SUMMARY OF THE INVENTION

An object of the present invention is to provide a structure that is adapted to a nuclear magnetic resonance apparatus in which the direction of a static magnetic field is horizontal, and that includes a reception probe coil and a detection loop which is magnetically coupled to the reception probe coil and can fetch a signal detected by the reception probe coil, and to provide a probe coil capable of readily measuring multiple nuclear species.

In order to accomplish the above object, a nuclear magnetic resonance probe coil in accordance with the present invention is adapted to a nuclear magnetic resonance apparatus in which a static magnetic field is horizontally applied. The probe coil includes multiple superconducting thin-film rings which are formed on respective substrates and each of which has an interdigital capacitor. The normals to the planes containing the respective multiple superconducting thin-film rings are extended vertically. Moreover, a reception coil is composed of a pair of superconducting thin-film rings contained in planes that are separated from each other by a predetermined inter-plane distance. A specimen is put into the superconducting thin-film rings constituting the reception coil. A transmission coil for use in exciting the specimen at a predetermined frequency is disposed to surround the reception coil while the normal to the plane containing the transmission coil is extended horizontally. A means for transmitting a signal is magnetically coupled to the superconducting thin-film rings. A signal acquired through the superconducting thin-film rings is taken out via the means for transmitting a signal.

A nuclear magnetic resonant probe coil in accordance with the present invention is a probe coil to which a static magnetic field is horizontally applied and which include superconducting thin-film rings contained in planes that have the normals thereto extended vertically. Consequently, a specimen can be put into the superconducting thin-film rings and a high fill factor of the specimen can be attained. Moreover, the multiple superconducting thin-film rings constitute a reception coil, and the reception coil is magnetically coupled to a means for transmitting a signal. Thus, a nuclear magnetic resonant probe coil capable of highly sensitively measuring multiple nuclear species is realized.

BRIEF DESCRIPTION OF THE DRAWINGS

These and other features, objects and advantages of the present invention will become more apparent from the following description when taken in conjunction with the accompanying drawings wherein:

FIG. 3A and FIG. 3B are a side view and a plan view respectively that illustratively show the structure of the probe coil 2 in accordance with the first embodiment;

DESCRIPTION OF THE PREFERRED EMBODIMENTS

Figure 1:
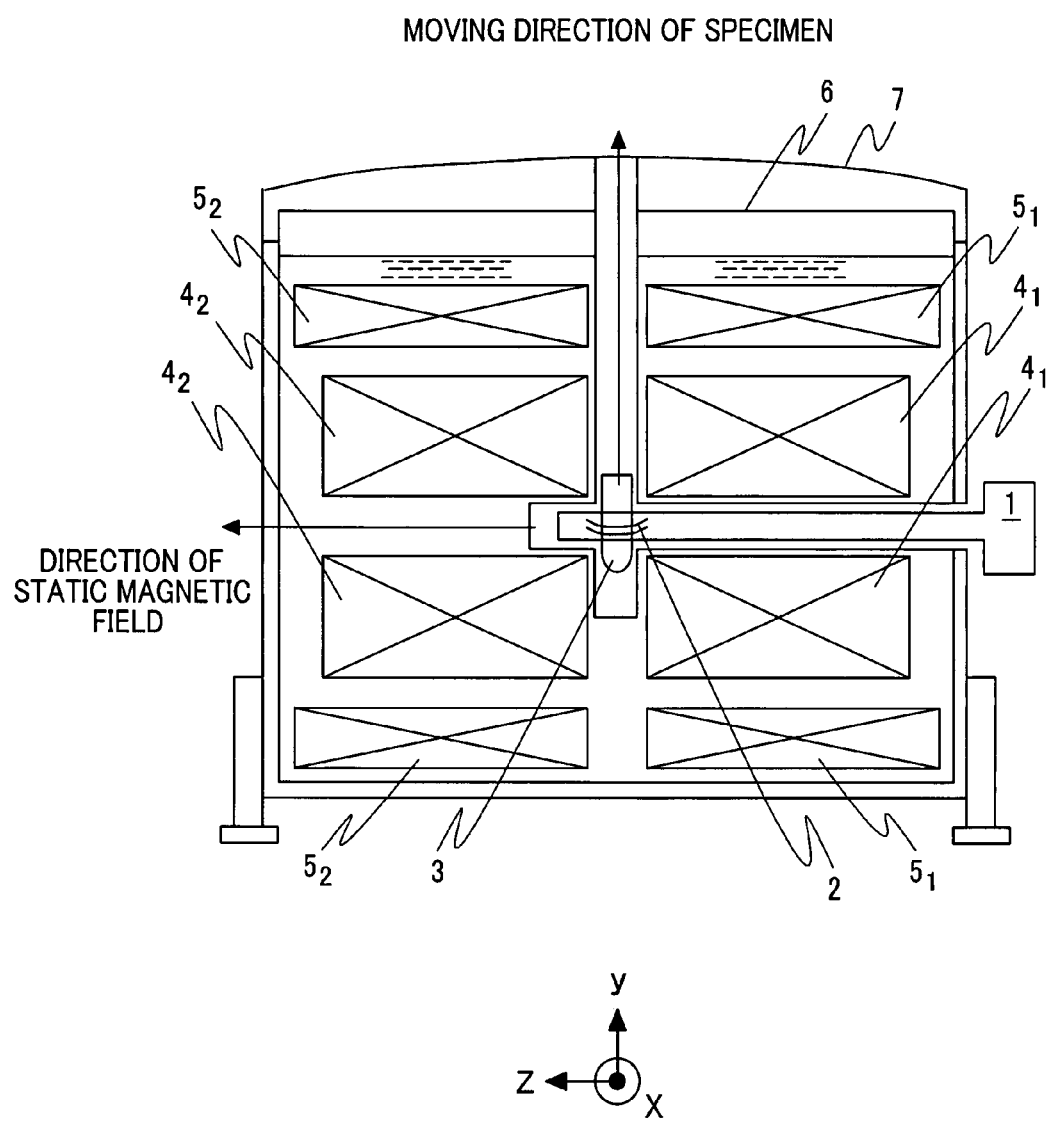
FIG. 1 schematically shows an overall configuration of nuclear magnetic resonance apparatuses in accordance with the first to third embodiments respectively.

Referring to the drawings, embodiments of the present invention will be described below.

First Embodiment

The first embodiment employs a probe, to which a static magnetic field is horizontally applied and which is horizontally extended in the form of a bar, for the purpose of realizing a high-sensitivity nuclear magnetic resonance apparatus. The probe has a reception coil, which is composed of superconducting thin-film rings, disposed in the distal part thereof. The first embodiment relates to the structure of a probe coil.

FIG. 1 is a sectional view showing the overall configuration of a nuclear magnetic resonance apparatus including a probe coil in accordance with the first embodiment. Reference numerals $4_1$ and $4_2$ denote solenoid coils that are produced by bisecting a coil and used to apply a static magnetic field and that are placed sideways. Reference numerals $5_1$ and $5_2$ denote solenoid coils that are produced by bisecting a coil and disposed on the peripheries of the solenoid coils $4_1$ and $4_2$ respectively for the purpose of correcting a magnetic field. The coils are mounted in tanks 6 and 7 that are combined with each other. The inner tank 6 is filled with liquid helium, while the outer tank 7 is filled with liquid nitrogen. The bores of the solenoid coils $4_1$ and $4_2$ are hollow, and a probe 1 is mounted in the hollow.

The probe 1 is horizontally extended like a bar, and a probe coil 2 is disposed in the distal part of the probe 1. A sample tube 3 in which a specimen to be measured is put is placed in the probe coil 2. A static magnetic field is horizontally applied to the position of the specimen to be measured. The sample tube 3 is vertically inserted into or pulled out of the space with which the solenoid coils $4_1$ and $4_2$ are separated from each other. Consequently, the probe coil 2 detects a vertical component of a magnetic moment exhibited by a specimen. Incidentally, the directions of X, Y, and Z axes shown in the lower part of FIG. 1 are equally applied to the other drawings.

In the first embodiment, a reception coil that is a key component of the probe coil 2 is composed of superconducting thin-film rings. A specimen is put into the superconducting thin-film rings, and the planes containing the respective coils transverse the specimen. Consequently, a fill factor by which the specimen occupies the space in which the reception coil can measure a magnetic moment is increased. This means that the magnetic moment exhibited by the specimen can be efficiently measured. Consequently, a high-sensitivity probe coil is realized. Since the specimen is vertically inserted or pulled out, the probe coil is designed so that the normals to the planes containing the respective superconducting thin-film rings will be extended vertically.

The superconducting thin-film rings are realized with superconducting thin films formed on respective substrates. In order to minimize the disorder of a static magnetic field caused by a superconductor having a large magnetic susceptibility, a volume of the static magnetic field interacting with the superconductor should be reduced. Since the normals to the planes containing the respective superconducting thin-film ring planes are extended vertically, the static magnetic field should be horizontally applied. A superconducting magnet is bisected in order to vertically insert or pull out a specimen and to horizontally apply the static magnetic field. For realization of a high-sensitivity probe coil, the homogeneity of the static magnetic field has to be attained, the space occupied by the probe coil has to be small, and a high quality (Q) factor has to be attained.

For induction of a homogeneous strong magnetic field, the diameter of the solenoid coils $4_1$ and $4_2$ that induces a magnetic field should preferably be decreased. The space to be occupied by the probe coil 2 disposed in the middle of the solenoid coils has to be small. In the first embodiment, a bisected superconducting magnet is employed. Consequently, for generation of a homogenous magnetic field space, the specimen space should be smaller than the one preserved in an apparatus that is described in U.S. Pat. No. 6,556,013 to employ a superconducting magnet which is not bisected but which generates a vertical magnetic field. Moreover, for attainment of a high Q factor, the probe coil 2 should be made of a low-resistance material or a superconductor.

Figure 2:
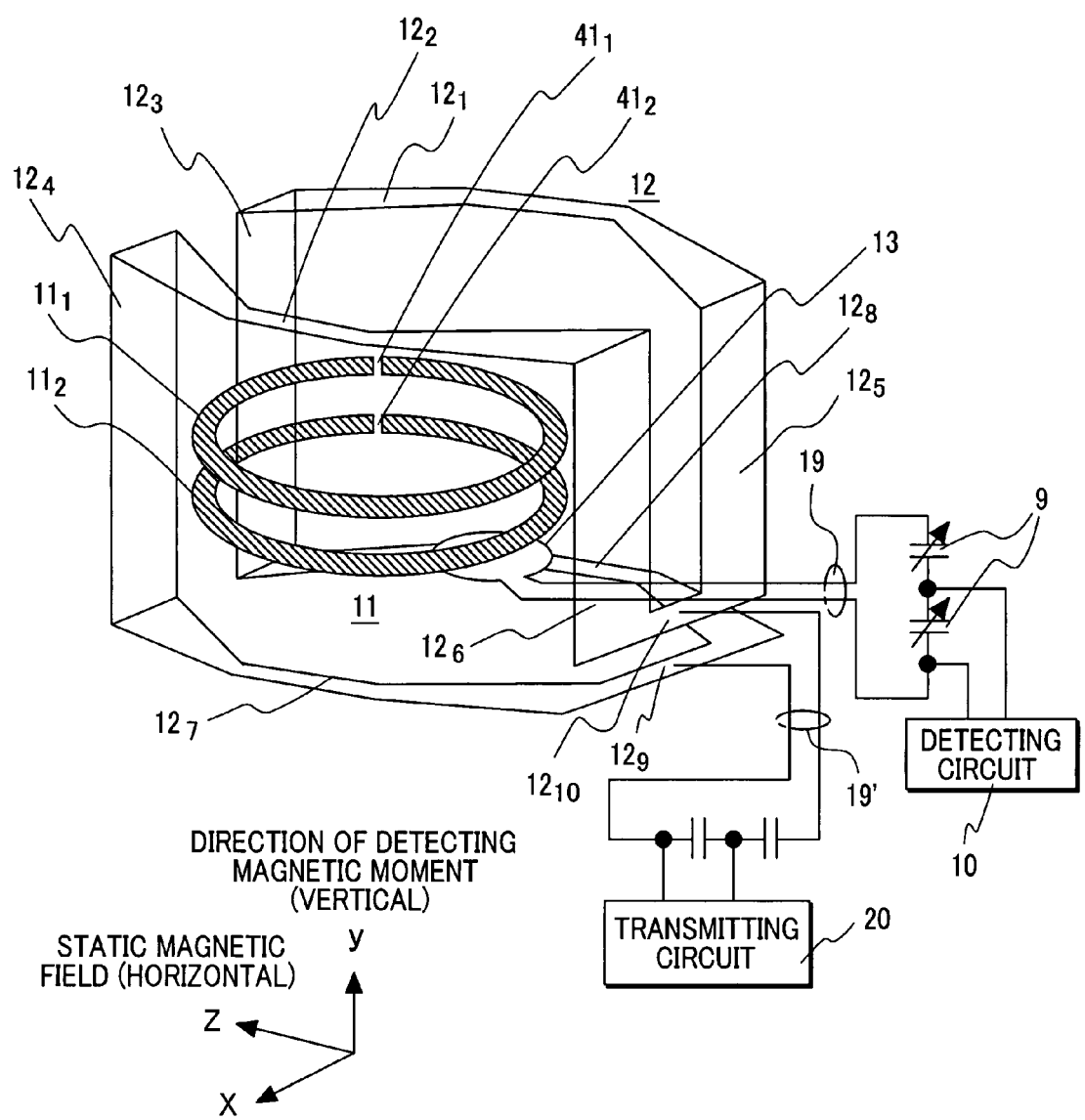
FIG. 2 is a perspective view illustratively showing the structure of a probe coil 2 in accordance with the first embodiment.

FIG. 2 is a perspective view illustratively showing the structure of the probe coil 2 in accordance with the first embodiment. The probe coil 2 includes a reception coil 11 that detects an output signal of a specimen, a transmission coil 12 that transmits a high-frequency signal to the specimen, and a detection loop 13 that fetches a signal detected by the reception coil 11. A static magnetic field is horizontally applied to the probe coil. The reception coil 11 detects a vertical component of a magnetic moment exhibited by the sample. A sample tube 3 is inserted into or pulled out of the reception coil 11.

Since the reception coil 11 is requested to offer high sensitivity, it is made of an oxide superconducting thin film $YBa_2Cu_3O_7$ that permits realization of high sensitivity. Reference numerals $11_1$ and $11_2$ denote superconducting thin-film rings which include interdigital capacitors $41_1$ and $41_2$ respectively. The two superconducting thin-film rings $11_1$ and $11_2$ constitute a resonator, and resonate with a high-frequency signal representing a magnetic moment exhibited by a specimen excited with a high-frequency signal. Since the two superconducting thin-film rings $11_1$ and $11_2$ have the interdigital capacitors $41_1$ and $41_2$ respectively formed therein, although they are realized with the superconducting thin films, a persistent current will not flow but a flowing current will decay for a predetermined time constant.

A signal produced by the resonator composed of the two superconducting thin-film rings $11_1$ and $11_2$ is detected by a detection loop 13 that is disposed immediately above the resonator and magnetically coupled thereto, routed to outside over a cable 19, and then detected by a resonant circuit including trimmer condensers 9 and a detecting circuit 10. Consequently, the resonant circuit composed of the two superconducting thin-film rings $11_1$ and $11_2$ exhibits a high Q factor. Herein, the detection loop 13 is disposed immediately below the superconducting thin-film rings $11_1$ and $11_2$ so that the plane containing the detection loop will be parallel to the planes containing the respective superconducting thin-film rings. Therefore, the superconducting thin-film rings $11_1$ and $11_2$ and the detection loop 13 are magnetically strongly coupled to each other. This leads to an improvement in signal intensity. Moreover, the detection loop 13 is partly open, and the cable 19 over which a signal is routed to outside is connected to the open part.

The transmission coil 12 is made of copper (Cu) that is a normal non-superconducting metal, and is disposed so that the normal to the plane containing the coil will be extended vertically and orthogonally to the direction of a static magnetic field. Reference numerals $12_1$ to $12_{10}$ denote coil fragments of the transmission coil. The coil fragments $12_1$ to $12_{10}$ are made of a normal non-superconducting metal, for example, formed with a copper foil of 0.1 mm thick, and assembled to construct a saddle-shaped coil. Specifically, the transmission coil 12 has two coils, which are a coil formed with the coil fragments $12_1$, $12_3$, $12_5$, and $12_8$ as one turn of wire and a coil formed with the coil fragments $12_2$, $12_4$, $12_6$, and $12_7$ as one turn of wire, connected in parallel so that the two coils will surround the reception coil. A large pulsating current is fed from a transmitting circuit 20 to the transmission coil 12 via the coil fragments $12_9$ and $12_{10}$, which link the one-turn-of-wire coils, over a cable 19' that contains a lead made of a normal non-superconducting metal. This causes a specimen, which is inserted into the space formed by the reception coil 11, to exhibit a magnetic moment orthogonal to a static magnetic field. The magnetic moment orthogonal to the static magnetic field gradually relaxes. A signal produced by the specimen at this time is received by the reception coil 11.

FIG. 3A and FIG. 3B are a side view and a plan view respectively that illustratively show the structure of the probe coil 2 in accordance with the first embodiment. For a better understanding, the plan view shows the structure with a sapphire substrate $16_1$, on which the superconducting thin-film ring $11_1$ is formed, excluded therefrom.

The reception coil 11 has the sapphire substrate $16_1$, which has the superconducting thin-film ring $11_1$ formed on the surface thereof, and a sapphire substrate $16_2$, which has the superconducting thin-film ring $11_2$ formed thereon, layered so that the sapphire substrates will sandwich a sapphire spacer 17. The normals to the sapphire substrates $16_1$ and $16_2$ are extended vertically. The two superconducting thin-film rings are opposed to each other with the sapphire spacer 17 between them. The superconducting thin-film rings $11_1$ and $11_2$ are separated from each other by an inter-plane distance determined with the thickness of the sapphire spacer 17. The sapphire substrates $16_1$ and $16_2$ and sapphire spacer 17 each have a hole 15 in the center thereof. The sample tube 3 is inserted into the holes.

The detection loop 13 is, as mentioned above, disposed immediately above the superconducting thin-film rings $11_1$ and $11_2$ so that the loop plane will be parallel to the superconducting thin-film ring planes. Moreover, part of the detection loop 13 is left open, and the cable 19 over which a signal is routed to outside is connected to the open part. Thus, a signal detected by the detection loop 13 is routed to outside over the cable 19.

In FIG. 3A, the one-turn-of-wire coil composed of the coil fragments $12_2$, $12_4$, $12_6$, and $12_7$ included in the transmission coil 12 is shown to look like a rectangular coil. In FIG. 3A, the cable 19' containing the leads, which are made of a normal non-superconducting metal and connected to the coil fragment $12_{10}$ joined to the coin fragment $12_6$ and the coil fragment $12_9$ joined to the coil fragment $12_7$ respectively, is shown as if to be connected to the coil fragments $12_6$ and $12_7$.

As seen from FIG. 3A and FIG. 3B, openings $21_1$, $21_2$, $21_3$, and $21_4$ through which the coil fragments $12_3$, $12_4$, $12_5$, and $12_6$ included in the transmission coil 12 are passed are formed in the sapphire substrates $16_1$ and $16_2$ and sapphire spacer 17. Thus, the transmission coil 12 is firmly secured to keep bearing a predetermined positional relationship to the reception coil 11.

In the first embodiment, an oxide superconducting thin film $YBa_2Cu_3O_7$ is adopted as a material made into the superconducting thin films. The substrates on which the respective superconducting thin films are formed should be made of a non-magnetic material in order to ensure homogeneity of a magnetic field. Moreover, a material exhibiting a high coefficient of thermal conductivity should be adopted in order to facilitate cooling of the superconducting thin films. In the first embodiment, the sapphire substrates $16_1$ and $16_2$ are used as the substrates satisfying both the requirements.

Figure 4A:
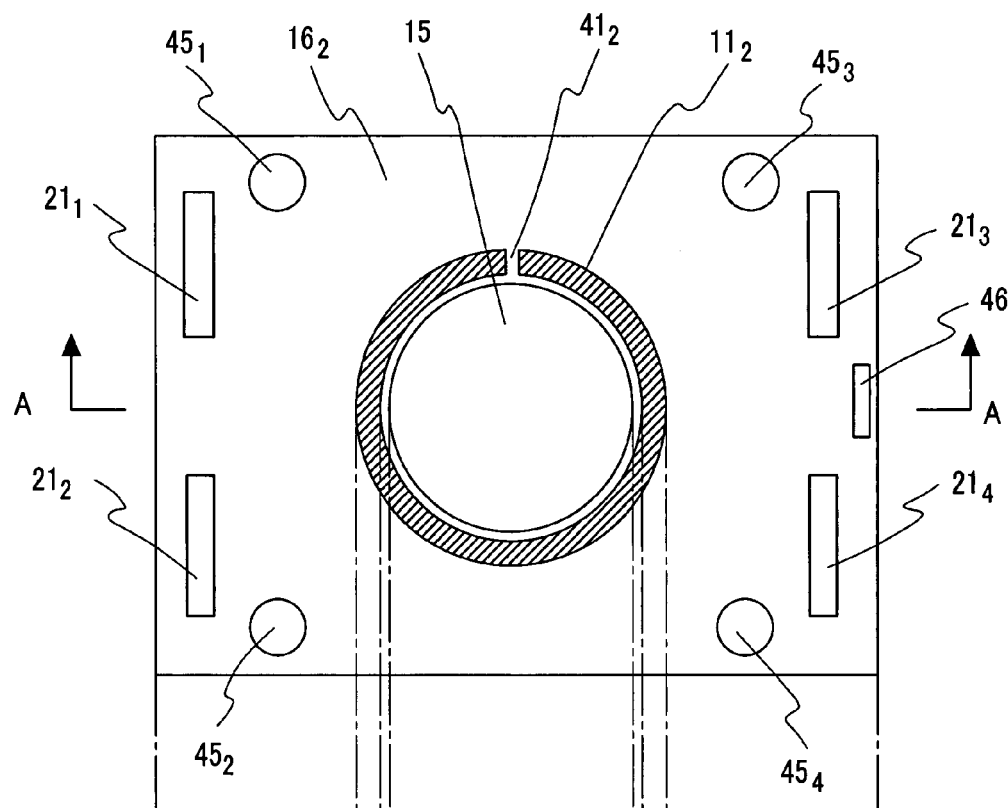
FIG. 4A and FIG. 4B are a plan view and a cross sectional view respectively that show the structure of a superconducting thin-film ring $11_2$ included in a reception coil 11 employed in the first embodiment.
Figure 4B:
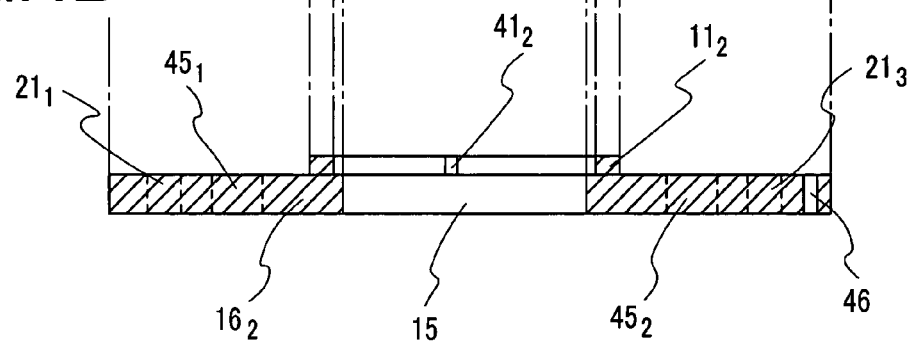

FIG. 4A and FIG. 4B are a plan view and a cross sectional view respectively that are used to explain the structure of the superconducting thin-film ring $11_2$ included in the reception coil 11 employed in the first embodiment. The cross sectional view of FIG. 4B shows an A-A cutting plane shown in the plan view of FIG. 4A and seen in an arrow direction. The superconducting thin-film ring $11_1$ has the same structure as the superconducting thin-film ring $11_2$.

The sapphire ($Al_2O_3$) substrate $16_2$ has the superconducting thin film $11_2$, which is made of an oxide superconducting thin film $YBa_2Cu_3O_7$, formed on the surface thereof in the shape of a ring. The interdigital capacitor $41_2$ is formed in part of the superconducting thin film. Reference numeral 15 denotes an opening into which the sample tube 3 is inserted. Insertion holes $45_1$, $45_2$, $45_3$, and $45_4$ into which respective bolts are inserted in order to fasten the sapphire substrate together with the other sapphire substrate are formed in the sapphire substrate. Moreover, an opening 46 serving as a passage of a line linked to the transmission probe coil 12 is formed in the sapphire substrate.

The ring of the superconducting thin film $11_2$ shown in FIG. 4A and FIG. 4B is produced as described below.

To begin with, a cerium oxide ($CeO_2$) layer having a thickness of 100 nm is formed on the sapphire ($Al_2O_3$) substrate $16_2$ as a buffer layer. Thereafter, the superconducting thin film $11_2$ made of the oxide superconducting thin film $YBa_2Cu_3O_7$ is formed thereon. The thickness of the $YBa_2Cu_3O_7$ thin film is larger than 100 nm that is a magnetic penetration depth. However, when the thickness of the $YBa_2Cu_3O_7$ thin film is equal to or larger than 1 µm, the irregularities on the surface thereof become outstanding. Therefore, the thickness of the $YBa_2Cu_3O_7$ thin film should preferably be equal to or larger than 100 nm and equal to or smaller than 1 µm. In the first embodiment, the thickness of the $YBa_2Cu_3O_7$ thin film is 150 nm. Thereafter, ordinary processes of resist coating, photolithography, and argon (Ar) etching are performed in order to process the $YBa_2Cu_3O_7$ thin film. Thus, a circular pattern is formed. Thereafter, a predetermined mask is used to form the interdigital capacitor $41_2$ in part of the superconducting thin-film ring.

Thereafter, the sapphire substrate $16_2$ is machined in order to form the hole 15 into which the test tube is inserted. Thus, the superconducting thin-film ring shown in FIGS. 4A and 4B is completed.

In the first embodiment, two coils, that is, the reception coil 11 composed of the superconducting thin-film rings contained in the planes having the normals thereto are extended vertically, and the transmission coil 12 contained in the plane having the normal thereto extended vertically and orthogonally to the direction of a static magnetic field are incorporated in a nuclear magnetic resonance apparatus in which the static magnetic field is horizontally applied. The reception coil 11 should preferably be more highly sensitive than the transmission coil 12. Therefore, the coil composed of the superconducting thin-film rings that are expected to offer high sensitivity and that are contained in the planes having the normals thereto extended vertically is adopted as the reception coil 11. The reception coil 11 is composed of the superconducting thin-film rings, and a specimen is placed in the reception coil 11. Moreover, the superconducting thin-film ring planes transverse the specimen. The detection loop 13 is magnetically coupled to the reception coil 11 as a means for transmitting a signal. Thus, the high-sensitivity probe coil 2 is realized. Consequently, the nuclear magnetic resonance apparatus in which a horizontal static magnetic field is applied and which offers high sensitivity is realized.

Second Embodiment

Figure 5A:
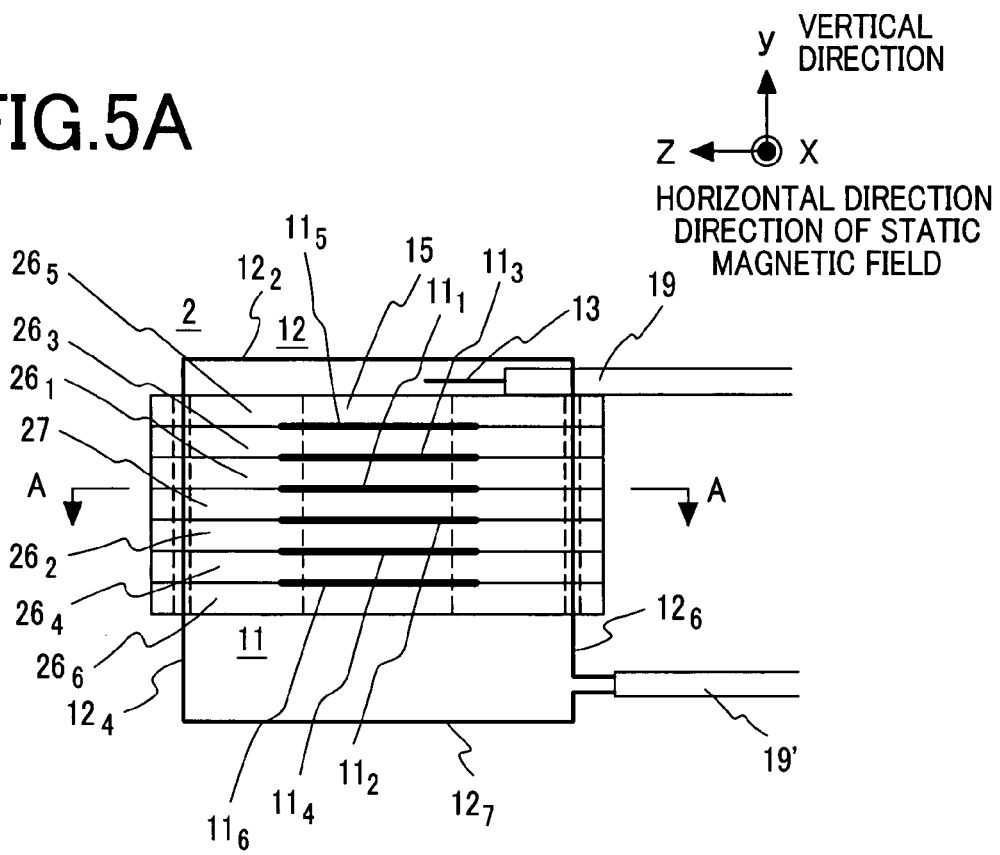
FIG. 5A and FIG. 5B are a side view and a plan view respectively that illustratively show the structure of a probe coil 2 in accordance with the second embodiment.
Figure 5B:
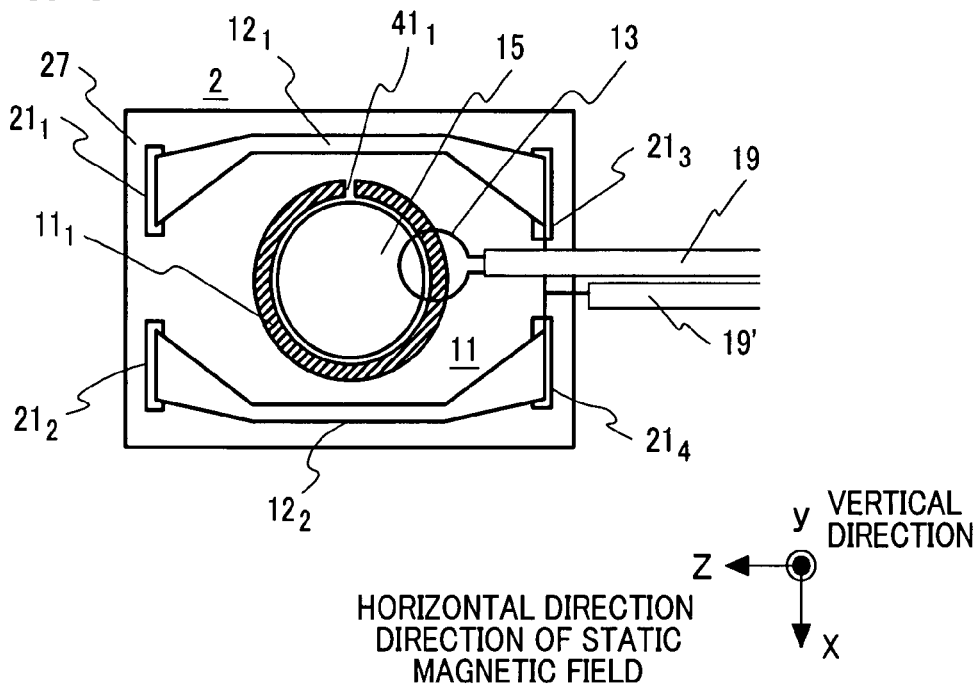

Next, the second embodiment of the present invention will be described below. The overall configuration of a nuclear magnetic resonance apparatus in accordance with the second embodiment is identical to that of the nuclear magnetic resonance apparatus in accordance with the first embodiment including the probe coil shown in FIG. 3 except a point that the structure of a reception coil is different from that of the reception coil 11 shown in FIG. 3 and employed in the first embodiment. FIG. 5A and 5B are a side view and a plan view respectively which illustratively show the structure of a probe coil 2 in accordance with the second embodiment. However, for a better understanding, the plan view shows the structure with a sapphire substrate $26_1$, on which a superconducting thin-film ring $11_1$ is formed, and sapphire substrates $26_3$ and $26_5$, which are located above the sapphire substrate $26_1$, excluded therefrom.

As readily seen from the comparison of FIG. 5 with FIG. 3, although the first embodiment uses the pair of superconducting thin-film rings $11_1$ and $11_2$ to construct the reception coil composed of superconducting thin-film rings contained in the respective planes which have the normals thereto extended vertically, the second embodiment uses numerous superconducting thin-film rings, that is, six superconducting thin-film rings $11_1$, $11_3$, $11_5$, $11_2$, $11_4$, and $11_6$, which are layered with a sapphire spacer 27 as a center layer, to construct the reception coil composed of superconducting thin-film rings contained in the respective planes which have the normals thereto extended vertically. The other features are identical to those of the reception coil employed in the first embodiment. Reference numerals $26_1$, $26_3$, $26_5$, $26_2$, $26_4$, and $26_6$ denote sapphire substrates on which the respective superconducting thin-film rings $11_1$, $11_3$, $11_5$, $11_2$, $11_4$, and $11_6$ are formed.

In the second embodiment, the employment of numerous superconducting thin-film rings leads to a rise in a fill factor by which a specimen occupies the space in which the reception coil 11 can measure a magnetic moment. Consequently, the magnetic moment exhibited by the specimen can be efficiently measured. The high-sensitivity probe coil 2 can be realized. Since the superconducting thin-film rings constituting the reception coil are disposed so that the normals to the respective planes containing the superconducting thin-film rings will be extended vertically, the sample tube 3 can be vertically inserted into or drawn out of the sample space 15.

Even in the second embodiment, the superconducting thin-film rings 11 are formed on the surfaces of respective sapphire substrates using an oxide superconducting thin film $YBa_2Cu_3O_7$. A static magnetic field is horizontally applied, and the normals to the superconducting thin-film ring planes are extended vertically. Therefore, a volume of the static magnetic field interacting with the superconductor is limited, and the disorder of the static magnetic field caused by the superconductor having a large magnetic susceptibility can be minimized. The sample tube 3 is inserted into or pulled out of the reception coil 11.

Third Embodiment

Figure 6A:
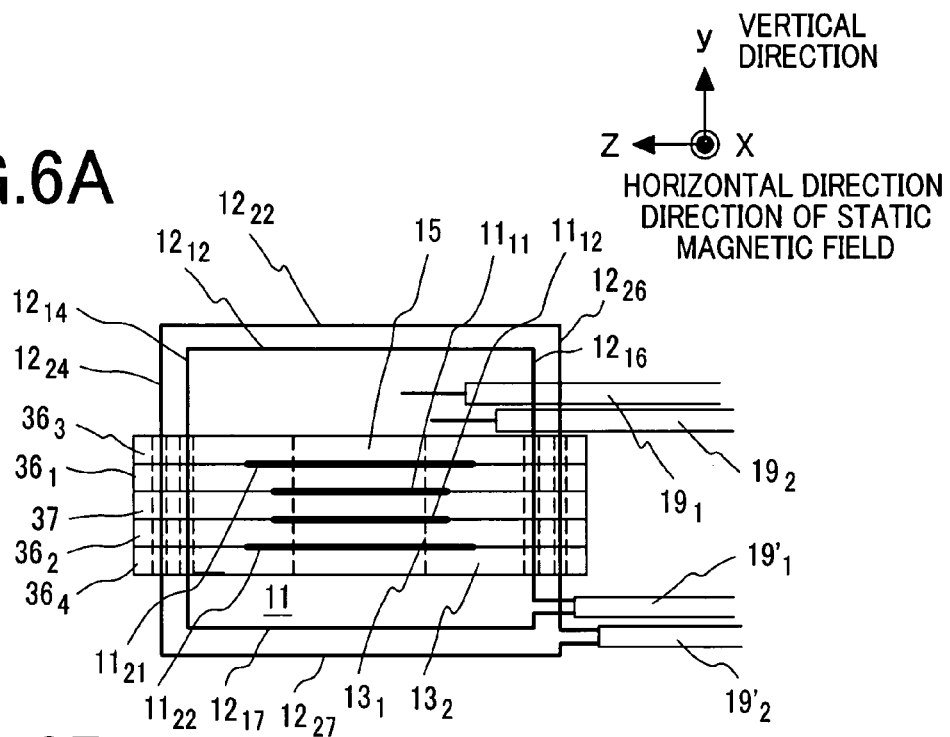
FIG. 6A and FIG. 6B are a side view and a plan view respectively that illustratively show the structure of a probe coil 2 in accordance with the third embodiment.
Figure 6B:
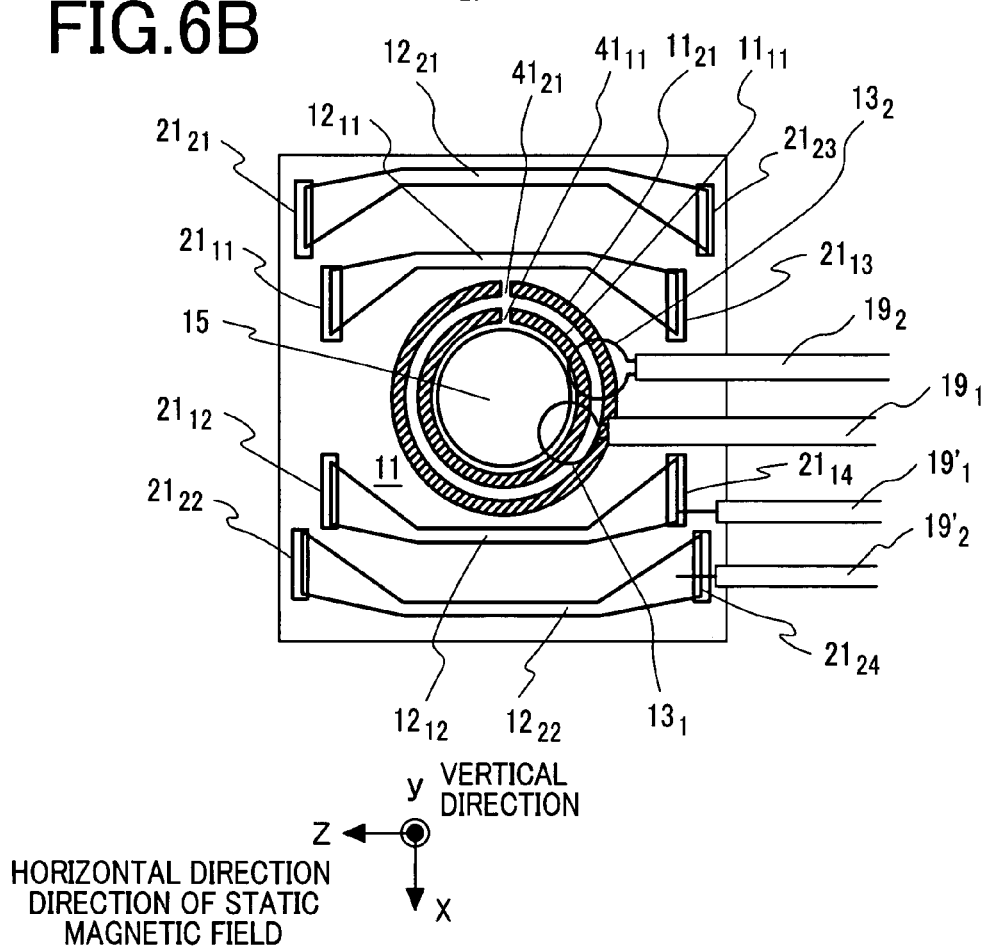

Next, the third embodiment of the present invention will be described below. The overall structure of a nuclear magnetic resonance apparatus in accordance with the third embodiment is identical to that of the nuclear magnetic resonance apparatus in accordance with the first embodiment including the probe coil shown in FIG. 3. The third embodiment is different from the first embodiment in a point that a probe coil 2 is designed to measure two nuclear species. FIG. 6A and FIG. 6B are a side view and a plan view respectively which illustratively shows the structure of the probe coil 2. For a better understanding, the plan view shows the structure with sapphire substrates, on which respective superconducting thin-film rings 11 are formed, ignored.

As readily seen from the comparison of FIG. 6 with FIG. 3, although the first embodiment uses the pair of superconducting thin-film rings $11_1$, $11_2$ to form the reception coil composed of superconducting thin-film rings contained in respective planes that have the normals thereto extended vertically, the third embodiment uses two pairs of superconducting thin-film rings to form the reception coil 11 composed of superconducting thin-film rings contained in respective planes that have the normals thereto extended vertically. Herein, the two pairs of superconducting thin-film rings include a pair of superconducting thin-film rings $11_1$ and $11_3$ formed on layered sapphire substrates $36_1$ and $36_2$ and a pair of superconducting thin-film rings $11_2$ and $11_4$ formed on layered sapphire substrates $36_3$ and $36_4$. The sapphire substrates $36_1$ and $36_2$ and the sapphire substrates $36_3$ and $36_4$ are layered with a sapphire spacer 37 as a center layer. Moreover, detection loops $13_1$ and $13_2$ fetch respective signals from the respective pairs of superconducting thin-film rings constituting the reception coil 11, and cables $19_1$ and $19_2$ are connected to the respective detection loops. The resonant frequencies of the pairs of superconducting thin-film rings constituting the reception coil 11 are designed to have values suitable for nuclear species that are objects of measurement. Holes 15 are formed in the centers of the layered sapphire spacer 37, sapphire substrates $36_1$ and $36_2$, and sapphire substrates $36_3$ and $36_4$ respectively. The sample tube 3 is inserted into the holes 15.

Two pair of transmission coils 12 are formed in association with the pairs of superconducting thin-film rings constituting the reception coil 11. A pulse to be transmitted from each transmission coil 12 is determined optimally for a nuclear species that is an object of measurement. The transmission coil 12 is, similarly to the one shown in FIG. 3, composed of coil fragments, but an iterative description will be omitted. Moreover, similarly to the one shown in FIG. 3, parts of the coil fragments constituting the transmission coils 12 are inserted into the openings formed in the sapphire substrates and thus held in the sapphire substrates. A large pulsating current is fed to the transmission coils 12 over cables $19_1'$ and $19_2'$ each containing leads made of a normal non-superconducting metal.

The other features are identical to those of the first embodiment.

Reference numerals $36_1$, $36_2$, $36_3$, and $36_4$ denote sapphire substrates on which the respective superconducting thin-film rings $11_{11}$, $11_{12}$, $11_{21}$, and $11_{22}$ are formed. The superconducting thin-film rings $11_{11}$ and $11_{12}$ are paired as one pair of superconducting thin-film rings, and the superconducting thin-film rings $11_{21}$ and $11_{22}$ are paired as the other pair of superconducting thin-film rings. The pairs of superconducting thin-film rings are associated with respective nuclear species that are objects of measurement. Thus, a nuclear magnetic resonance probe coil capable of measuring two nuclear species is realized. The sample tube 3 is inserted into or pulled out of the sample space 15 of the reception coil.

In the first embodiment, one pair of superconducting thin-film rings is used to form a reception coil composed of superconducting thin-film rings contained in respective planes that have the normals thereto extended vertically. In the third embodiment, two detection loops 13 are included in association with the pairs of superconducting thin-film rings constituting the reception coil 11. The respective detection loops 13 fetch signals from the pairs of superconducting thin-film rings constituting the reception coil 11.

The pair of superconducting thin-film rings formed on the sapphire substrates $36_1$ and $36_2$ has the same diameter. The planes containing the respective superconducting thin-film rings formed on the sapphire substrates $36_1$ and $36_2$ are separated by an inter-plane distance determined with the thickness of the sapphire spacer 37. The pair of superconducting thin-film rings formed on the sapphire substrates $36_1$ and $36_2$ serves as a resonator. Moreover, the superconducting thin-film rings formed on the respective sapphire substrates $36_3$ and $36_4$ have the same diameter that is larger than the diameter shared by the pair of superconducting thin-film rings formed on the sapphire substrates $36_1$ and $36_2$. The superconducting thin-film rings formed on the respective sapphire substrates $36_3$ and $36_4$ are separated from each other by a distance corresponding to the sum of the thickness of the sapphire spacer 37 and the thicknesses of the sapphire substrates $36_1$ and $36_2$ respectively, and constitute a resonator. The resonators have mutually different resonant frequencies and are associated with respective nuclear species that are objects of measurement.

A procedure of producing the superconducting thin-film rings $11_{11}$, $11_{12}$, $11_{21}$, and $11_{22}$ employed in the third embodiment is identical to the one adopted for the first embodiment and described with reference to FIG. 4. An iterative description shall be omitted.

Fourth Embodiment

In relation to the fourth embodiment, a concept for a structure to be used to mount a reception coil described in relation to the first embodiment will be described with reference to FIG. 7 and FIG. 8.

Figure 7:
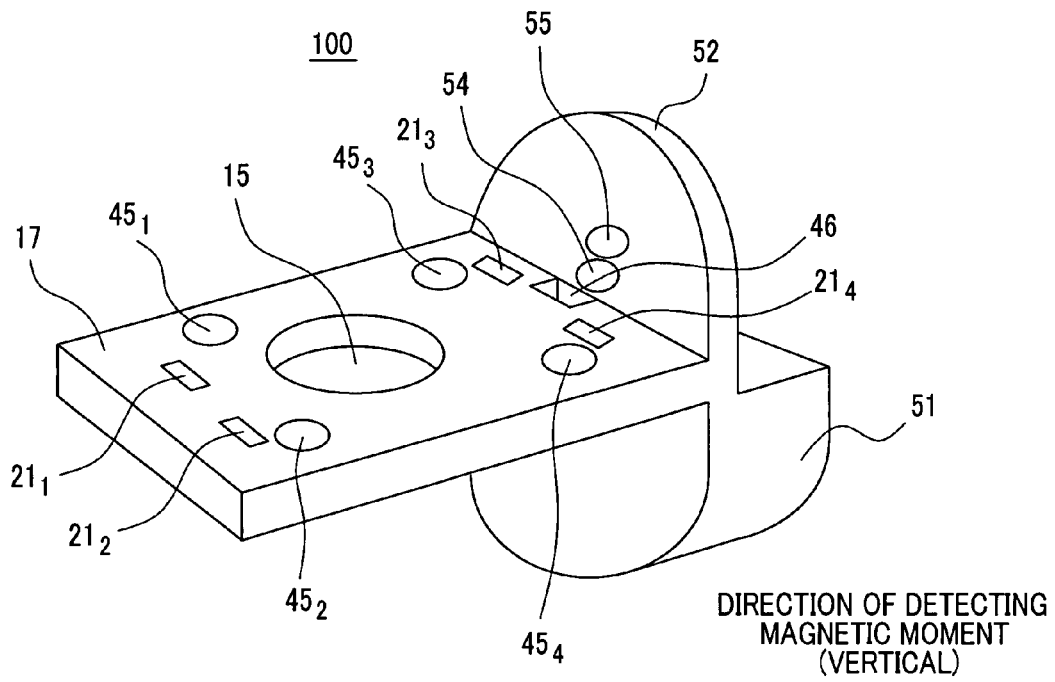
FIG. 7 is a perspective view showing a supporting holder 100 for use in mounting a reception coil.

FIG. 7 is a perspective view showing a supporting holder 100 for use in mounting a reception coil. The supporting holder 100 has a columnar part 51 and a protecting part 52, which are made of sapphire, united with the sapphire spacer 17 to be included in the probe coil 2 in accordance with the first embodiment described in conjunction with FIG. 3. Herein, insertion holes $45_1$, $45_2$, $45_3$, and $45_4$ into which bolts are inserted in order to fasten the layered sapphire substrates are formed in the sapphire spacer 17. Moreover, an opening 46 serving as a passage of a line to be connected to the transmission coil 12 is formed in the sapphire spacer 17. The other structural features are identical to those described in conjunction with FIG. 3. An opening 54 serving as a passage of a line to be spliced to the cable 19 extended from the detection loop 13 and an opening 55 serving as a passage of a line to be spliced to the cable 19' connected to the transmission coil 12 are formed in the protecting part 52.

Figure 8:
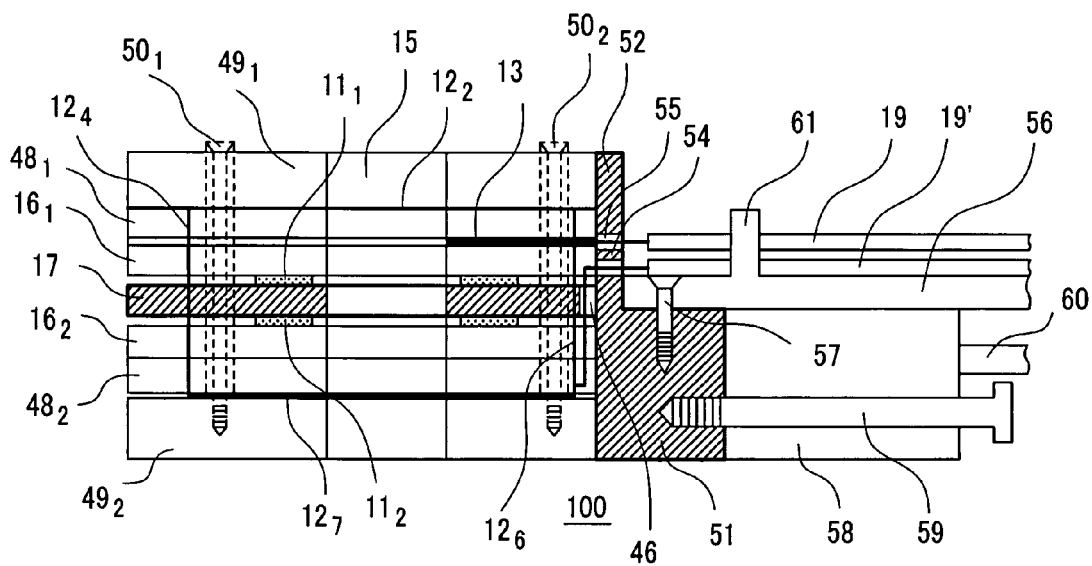
FIG. 8 is a cross sectional view schematically showing an entire structure that has the probe coil 2, which is shown in FIG. 3, constructed using the supporting holder 100 shown in FIG. 7.

FIG. 8 is a cross sectional view schematically showing an entire structure that has the probe coil 2 shown in FIG. 3 constructed using the supporting holder 100. For a better understanding, portions of FIG. 8 showing the sapphire spacer 17, columnar part 51, and protecting part 52 respectively are hatched, and portions thereof showing the superconducting thin-film rings $11_1$ and $11_2$ are dotted. The other portion of FIG. 8 is not hatched. Reference numerals $16_1$ and $16_2$ denote sapphire substrates on which the respective superconducting thin-film rings $11_1$ and $11_2$ are formed. The sapphire substrates $16_1$ and $16_2$ are layered on the sapphire spacer 17 so that the superconducting thin-film rings $11_1$ and $11_2$ will be opposed to each other. The detection loop 13 and a line connected to the detection loop 13 are disposed on the back of the sapphire substrate $16_1$. The line is led to outside through the opening 55, and spliced to the cable 19.

Sapphire spacers $48_1$ and $48_2$ are layered on the backs of the respective sapphire substrates $16_1$ and $16_2$. The external surfaces of the sapphire spacers $48_1$ and $48_2$ are used to construct the transmission coil 12. A lead made of a normal non-superconducting metal is connected to the transmission coil 12, led to outside through the openings 46 and 54, and then spliced to the cable 19'. Protective sapphire covers $49_1$ and $49_2$ are layered on the external surfaces of the respective sapphire spacers $48_1$ and $48_2$. The sapphire covers $49_1$ and $49_2$ are fastened with bolts $50_1$ and $50_2$, whereby the sapphire spacer 17, the sapphire substrates $16_1$ and $16_2$ on which the respective superconducting thin-film rings $11_1$ and $11_2$ are formed, the detection loop 13, and transmission coil 12 are joined as shown in FIG. 3.

A supporting plate 56 is fixed to the columnar part 51 using a screw 57, and borne by a structural member that is included in the nuclear magnetic resonance apparatus and that is not shown. A heat exchanger 58 held by the supporting plate 56 is fixed to the columnar part 51 using a bolt 59. A copper pipe 60 along which a coolant is fed to the heat exchanger 58 is connected to the heat exchanger 58. The supporting plate 56 has a holding part 61 that holds the cables 19 and 19'. The cables 19 and 19' are securely held by the holding part 61.

Referring to FIG. 7 and FIG. 8, a description has been made of the probe coil including the reception coil composed of a pair of superconducting thin-film rings and the transmission coil. Even when the reception coil is composed of two or more pairs of superconducting thin-film rings, the supporting holder can be used to construct a similar structure. An iterative description shall be omitted.

According to the fourth embodiment, there is provided a probe coil that is made of a superconductor, that exhibits a high Q factor under a horizontally applied static magnetic field, that induces a highly homogeneous magnetic field, and that occupies a small space. Specifically, the columnar part 51 and sapphire spacer 17 are integrated into one unit. The columnar part 51 is cooled using the heat exchanger 58 in order to maintain low temperature. Thus, the probe coil that is compact and effectively cooled is realized.

In the fourth embodiment, the supporting holder 100 is made of sapphire. Sapphire may be replaced with aluminum nitride that offers a large coefficient of thermal conductivity and is an electrically insulating substance. In this case, the superconducting thin-film rings can be efficiently cooled while being electrically insulated. Moreover, the superconducting thin-film rings are mechanically strong.

According to the present invention, multiple reception coils are arranged and magnetically coupled to means for transmitting a signal. Thus, a nuclear magnetic resonance probe coil capable of highly sensitively measuring multiple nuclear species and being adapted to a nuclear magnetic resonance apparatus in which the direction of a static magnetic field is horizontal can be realized.

What is claimed is:

1. A nuclear magnetic resonance apparatus comprising at least:
   a means for horizontally applying a static magnetic field;
   a means for vertically moving a specimen to a predetermined position in the apparatus;
   a probe including in the distal part thereof a transmission coil that applies a radiofrequency signal to the specimen; and
   a reception coil that detects a signal produced by the sample,
   wherein the reception coil includes:
      a pair of substrates having respective superconducting thin-film rings, each of which includes an interdigital capacitor, formed on the surfaces thereof;
      a spacer separating the superconducting thin-film rings from each other by a predetermined inter-plane distance; and
      a detection loop that is magnetically coupled to the superconducting thin-film rings;
   the normals to the planes containing the respective superconducting thin-film rings are extended vertically; and
   the normal to the plane containing the transmission coil is extended horizontally, and the transmission coil bears a predetermined positional relationship to the reception coil.

2. The nuclear magnetic resonance apparatus according to claim 1, wherein the substrates and spacer are made of sapphire.

3. The nuclear magnetic resonance apparatus according to claim 1, wherein a plurality of pairs of substrates having respective superconducting thin-film rings, each of which includes the interdigital capacitor, formed thereon is included.

4. The nuclear magnetic resonance apparatus according to claim 1, wherein:
   a plurality of pairs of substrates having respective superconducting thin-film rings, each of which includes the interdigital capacitor, formed thereon is included, and the diameter of one pair of superconducting thin-film rings is different from the diameter of the other pair of superconducting thin-film rings;
   the same number of detection loops, which are magnetically coupled to the pairs of superconducting thin-film rings, as the number of pairs of superconducting thin-film rings is included; and
   the same number of transmission coils as the number of pairs of superconducting thin-film rings is included.

5. A probe comprising:
   a spacer;
   a columnar part and a protecting part integrated with one end of the spacer;
   a pair of substrates having respective superconducting thin-film rings, each of which includes an interdigital capacitor, formed on the surfaces thereof so that the superconducting thin-film rings will abut on the spacer;
   a detection loop magnetically coupled to the superconducting thin-film rings; and
   a transmission coil contained in a plane having the normal thereto extended horizontally and disposed to bear a predetermined positional relationship to the superconducting thin-film rings,
   wherein the normals to the planes containing the respective superconducting thin-film rings are extended vertically.

6. The probe according to claim 5, wherein an opening serving as a passage of a line extended from the detection loop that is magnetically coupled to the superconducting thin-film rings is formed in the protecting part, and an opening serving as a passage of a line connected to the transmission coil is formed therein.

7. The probe according to claim 5, wherein a heat exchanger to which a pipe along which a coolant is fed is connected is held by a supporting plate borne by a structural member included in a nuclear magnetic resonance apparatus, and the heat exchanger is fixed to the columnar part.

8. The probe according to claim 5, wherein a cable to which the line extended from the detection loop is spliced and a cable connected to the transmission coil are held by the supporting plate borne by the structure member included in the nuclear magnetic resonance apparatus.

9. The probe according to claim 5, wherein the spacer, the columnar part, the protecting part, and the substrates are made of sapphire.

10. The probe according to claim 5, wherein a plurality of pairs of substrates having respective superconducting thin-film rings, each of which includes the interdigital capacitor, formed on the surfaces thereof is included.

11. The probe according to claim 5,
   wherein a plurality of pairs of substrates having respective superconducting thin-film rings, each of which includes the interdigital capacitor, formed on the surfaces thereof is included, and the diameter of one pair of superconducting thin-film rings is different from the diameter of the other pair of superconducting thin-film rings;

the same number of detection loops, which are magnetically coupled to the pairs of superconducting thin-film rings, as the number of pairs of superconducting thin-film rings is included; and the same number of transmission coils as the number of pairs of superconducting thin-film rings is included.

* * * * *